(12) United States Patent
Becker et al.

(10) Patent No.: US 12,078,687 B2
(45) Date of Patent: Sep. 3, 2024

(54) ELECTRICAL DEVICE

(71) Applicant: ams-OSRAM International GmbH, Regensburg (DE)

(72) Inventors: Dirk Becker, Langquaid (DE); Zeljko Pajkic, Regensburg (DE); Thomas Kippes, Neumarkt (DE)

(73) Assignee: ams-OSRAM International GmbH, Regensburg (DE)

( * ) Notice: Subject to any disclaimer, the term of this patent is extended or adjusted under 35 U.S.C. 154(b) by 86 days.

(21) Appl. No.: 17/998,912

(22) PCT Filed: May 10, 2021

(86) PCT No.: PCT/EP2021/062382
§ 371 (c)(1),
(2) Date: Nov. 15, 2022

(87) PCT Pub. No.: WO2021/244827
PCT Pub. Date: Dec. 9, 2021

(65) Prior Publication Data
US 2023/0213595 A1    Jul. 6, 2023

(30) Foreign Application Priority Data
Jun. 2, 2020 (DE) .................. 102020114669.8

(51) Int. Cl.
*G01R 31/67* (2020.01)
*G01R 31/28* (2006.01)

(52) U.S. Cl.
CPC ......... *G01R 31/67* (2020.01); *G01R 31/2879* (2013.01); *G01R 31/2884* (2013.01)

(58) Field of Classification Search
USPC ........................................ 324/204
See application file for complete search history.

(56) References Cited

U.S. PATENT DOCUMENTS

2011/0003404 A1    1/2011  Wang et al.
2012/0229156 A1*   9/2012  Vazzoler .............. H02S 50/10
                                              324/755.01

FOREIGN PATENT DOCUMENTS

DE        102014201166 A1    8/2015

* cited by examiner

*Primary Examiner* — Farhana A Hoque
(74) *Attorney, Agent, or Firm* — Slater Matsil, LLP (57) ABSTRACT

In an embodiment a method includes providing a substrate having at least one conductor track situated thereon, applying at least one accumulation of an electrically conductive material to a surface of the conductor track, providing a carrier having at least one electrical contact, applying an electrically conductive adhesive to the at least one accumulation of the electrically conductive material and/or the at least one electrical contact and arranging the substrate and the carrier such that the accumulation of the electrically conductive material and the at least one electrical contact are situated opposite and at a distance from one another, wherein the electrically conductive adhesive forms a mechanical and electrical connection between the accumulation of the electrically conductive material and the at least one electrical contact, and wherein an interspace between the at least one accumulation of the electrically conductive material and the at least one electrical contact is filled with the electrically conductive adhesive.

21 Claims, 5 Drawing Sheets

ELECTRICAL DEVICE

This patent application is a national phase filing under section 371 of PCT/EP2021/062382, filed May 10, 2021, which claims the priority of German patent application 10 2020 114 669.8, filed Jun. 2, 2020, each of which is incorporated herein by reference in its entirety.

TECHNICAL FIELD

The present invention relates to a method for producing an electrical device, in particular an optoelectronic device, and also to an electrical device, in particular an optoelectronic device, and to a method for testing the electrical device, in particular optoelectronic device, with regard to its functionality.

BACKGROUND

Since conductor tracks composed of a metal or a metal alloy, comprising aluminum or copper, for example, oxidize very rapidly in contact with oxygen, for electrical devices there is the problem of nevertheless establishing an electrical connection between a conductor track and an electrical contact. In this case, the oxide layer produced on the conductor tracks as a result of contact with oxygen is usually a few nanometers thick and very dense.

In order to penetrate through said oxide layer on the conductor track, it is possible for example to apply mechanical pressure in order to establish an electrical connection. For optoelectronic devices, for example, at the present time this can be done for example by means of ultrasonic bonding (US bonding) or an adhesive bonding method with a combined mechanical treatment, such as thermobonding, for example. In this case, the oxide layer on the conductor track is perforated by the mechanical loading and unoxidized conductor track material is available for an electrical contact.

At the same time, however, it is possible for such a contacting process to be made more difficult owing to the available space. In this regard, it may be possible, for example, that a component having a conductor track situated thereon is intended to be arranged in a cavity and connected to an electrical contact. In this case, one problem that occurs may be that not enough space is available for a mechanical joining process, such as US bonding, for example.

SUMMARY

Embodiments provide an improved production method which prevents this problem.

A method according to embodiments of the invention for producing an electrical device comprises providing a substrate having at least one conductor track situated thereon; applying at least one accumulation of an electrically conductive material, in particular a bonding material, to a surface of the conductor track; providing a carrier having at least one electrical contact situated thereon; applying an electrically conductive adhesive to the at least one accumulation of the electrically conductive material and/or the at least one electrical contact; and arranging the substrate and the carrier in such a way that the accumulation of an electrically conductive material and the at least one electrical contact are situated opposite and at a distance from one another, wherein the electrically conductive adhesive produces a mechanical and electrical connection between the accumulation of an electrically conductive material and the at least one electrical contact.

The material of the conductor track can be for example cost-effective materials, such as aluminum, copper, metal alloys comprising aluminum or copper, or a comparable metal. The conductor track can be formed in the shape of at least one conductor loop having at least a first and a second end and can be arranged on the substrate. At least one accumulation of an electrically conductive material, in particular a bonding material, can be applied to the opposite surface of the conductor track with respect to the substrate. In this case, the at least one accumulation of an electrically conductive material can expediently be arranged on the surface of the conductor track in the region of a first end of the conductor track.

Further, the method according to embodiments of the invention comprises providing a carrier having at least one electrical contact situated thereon. In this case, however, the term carrier is not intended to be understood as limiting to a planar carrier, rather it is also possible for the carrier to have one or more cavities, one or more elevations, and also one or more windows or interruptions. The carrier can be formed for example from a soldering-stable material such as ceramic, a plastic, glass, a semiconductor material, or a composite material composed of at least two of the materials mentioned.

The at least one electrical contact situated on the carrier can comprise for example a material such as gold, silver, or a comparable material. It may likewise be possible for the material of the at least one electrical contact situated on the carrier to differ from the material of the conductor track.

An electrically conductive adhesive is applied to the at least one accumulation of an electrically conductive material and/or to the at least one electrical contact. Accordingly, either the electrically conductive adhesive can be applied to the at least one accumulation of an electrically conductive material or the at least one electrical contact, or the electrically conductive adhesive can be applied to the at least one accumulation of an electrically conductive material and the at least one electrical contact. For the sake of better conductivity of the adhesive, the latter can comprise electrically conductive particles, for example.

The substrate having the conductor track situated thereon and the at least one accumulation of an electrically conductive material in turn situated thereon is arranged relative to the carrier having the at least one electrical contact situated thereon in such a way that the at least one accumulation of an electrically conductive material and the at least one electrical contact are situated opposite and at a distance from one another. In this case, the distance between the at least one accumulation of an electrically conductive material and the at least one electrical contact should be as small as possible. However, the at least one accumulation of an electrically conductive material and the at least one electrical contact should preferably not directly touch one another.

The electrically conductive adhesive produces a mechanical connection between the substrate and the carrier and also an electrical connection between the at least one accumulation of an electrically conductive material and the at least one electrical contact. In this case, the at least one accumulation of an electrically conductive material can firstly serve as lateral mechanical anchoring in the region of the electrically conductive adhesive and thus provide an improved mechanical connection between the substrate and the carrier. Secondly, the surface area of the conductor track that is wetted with electrically conductive adhesive can be enlarged by means of the at least one accumulation of an electrically conductive material in order to provide an improved electrical connection between the conductor track and the at least one electrical contact.

The at least one accumulation of an electrically conductive material can comprise at least one of the following materials: gold, silver, copper, a combination of these materials, and a metal having a higher standard potential than a material of the conductor track. In other words, one configuration provides for the at least one accumulation to comprise an electrically conductive material which has a reduced redox potential compared with the material of the conductor track and, consequently, in contact with oxygen, has a lower oxidation potential.

In a further embodiment, the surface of the conductor track can have an oxidized layer. In this case, the oxidized layer can be removed and/or perforated in the region of the accumulation of an electrically conductive material. The oxidized layer can be removed and/or perforated in the region of the accumulation for example as a result of applying the accumulation of an electrically conductive material.

The accumulation of an electrically conductive material can have the shape of at least one drop, the shape of a tail, or the shape of a wedge. It is likewise possible for the accumulation to have a combination of at least two out of at least one drop, a tail and a wedge. In this case, the terms tail and wedge should be understood to the greatest possible extent in accordance with the terminology and the correspondingly associated shape from wire bonding—wedge bond and tail bond. This likewise applies to the term drop, which in a manner corresponding to a ball bond to the greatest possible extent can be understood as a ball having a material stump protruding therefrom. However, this is not intended to be limiting to the shapes known from the wire bonding process, rather it is likewise conceivable for the accumulation of an electrically conductive material also to have some other comparable shape.

In this case, the shape of a drop, a tail and/or a wedge can be produced in this way by an electrically conductive material being applied and/or melted on the surface of the conductor track and a material excess that protrudes from the drop, tail and/or wedge being torn off and/or sheared off at a location directly above the drop, tail and/or wedge.

It may likewise be possible for the at least one accumulation of an electrically conductive material to be formed from at least two out of a first drop, a tail, a second drop and a wedge, which are connected to one another via a bonding wire. In this case, the first drop and/or tail and/or second drop and/or wedge can each be arranged directly on the surface of the conductor track. Accordingly, "handles" can in each case form from the at least two shapes connected to one another via a bonding wire. Such a shape can be produced by means of a commercial wire bonding process, for example, and can be similar to the greatest possible extent to a standard ball-wedge bond, tail-wedge bond or wedge-wedge bond.

Accordingly, by means of such a process, a bonding wire can be led from one out of a first drop, a tail, a second drop or a wedge and can be led toward one out of a first drop, a tail, a second drop or a wedge.

Applying the at least one accumulation of an electrically conductive material to the surface of the conductor track can be realized by at least one of the following methods:
    ultrasonic bonding;
    ultrasonic welding;
    spot welding; and
    wire bonding.

With the aid of these methods, for example, an oxidized layer that may have formed on the surface of the conductor tracks can be perforated and a mechanical and also electrical connection between the conductor track and the accumulation of an electrically conductive material can be produced.

In a further exemplary embodiment, the substrate can comprise an optoelectronic component. Such an optoelectronic component can be formed by an LED or a laser diode, for example. The conductor track which is arranged on the substrate and can be embodied for example as a conductor loop having two ends can be configured for checking the functionality of the optoelectronic component. For the case where the substrate and accordingly the optoelectronic component breaks, with the aid of applying for example a current to the two ends of the conductor loop it is possible to check whether an electrical variable measured via the conductor loop, such as voltage, resistance or conductance, for example, exceeds an expected value and a possible malfunction of the optoelectronic component can thus be deduced.

In a further exemplary embodiment, the carrier can have a cavity, in which the substrate having the conductor tracks situated thereon can be arranged. In such a case, it may be difficult, for example, by means of a mechanical method such as ultrasonic welding, for example, to electrically connect the conductor track and the at least one electrical contact arranged on the carrier to one another owing to the little space available, and to perforate the oxidized layer possibly situated on the conductor track. Accordingly, embodiments of the present invention propose a method in which at least one accumulation of an electrically conductive material is applied to a conductor track for example by means of a mechanical method, such as US welding, for example, and the resultant intermediate product can be adhesively bonded onto at least one electrical contact into a cavity of a carrier by means of an electrically conductive adhesive. As a result, it is possible to decouple a mechanical process and an adhesive bonding process.

An electrical device according to embodiments of the invention comprises a substrate having at least one conductor track situated thereon, and also a first accumulation of an electrically conductive material on a surface of the conductor track, and a carrier having a first electrical contact. Furthermore, the electrical device according to embodiments of the invention comprises an electrically conductive adhesive. In this case, the substrate and the carrier are arranged in such a way that the first accumulation of an electrically conductive material and the first electrical contact are situated opposite and at a distance from one another. In this case, the electrically conductive adhesive is arranged between the first accumulation of an electrically conductive material and the first electrical contact in such a way that it electrically and mechanically connects the substrate and the carrier to one another.

In this case, the at least one conductor track can be formed for example from a metal or a metal alloy comprising aluminum or copper, for example, or a comparable material.

The first accumulation of an electrically conductive material can comprise at least one of the following materials: gold, silver, copper, a combination thereof, and a metal having a higher standard potential than a material of the conductor track. In other words, the first accumulation comprises an electrically conductive material which has a reduced redox potential compared with the material of the conductor track and, consequently, oxidizes more slowly in contact with oxygen.

By contrast, the surface of the conductor track can have an oxidized layer. The oxidized layer in the region of the first accumulation of an electrically conductive material can be removed and/or perforated. Accordingly, the first accumulation of an electrically conductive material can be in direct contact with the material of the conductor track.

The first accumulation of an electrically conductive material can be formed in the shape of a first drop and/or a tail and can have a torn-off area and/or a cut area at a location directly above the first drop and/or tail. The first accumulation of an electrically conductive material in the shape of a first drop and/or a tail can be formed for example by—as in the case of a wire bonding process—an electrically conductive material being applied and/or melted onto the surface of the conductor track, this material then being bonded onto the surface of the conductor track by means of ultrasonic welding, for example, and, with a further material inflow of the electrically conductive material being prevented, the material inflow being torn off and/or sheared off directly above the first drop and/or tail.

Furthermore, it is possible for the accumulation of an electrically conductive material to be formed in the shape of a first drop or a tail, from which a bonding wire runs to a second drop or a wedge. In this case, the second drop or wedge is arranged at a distance from the first drop or tail likewise on the conductor track. As a result, a shape similar to a "handle" can form, for example.

In a further exemplary embodiment, it is possible for the substrate to comprise an optoelectronic component. In this case, the optoelectronic component can be formed by an LED or a laser diode.

It may also be the case that the electrical device comprises a second accumulation of an electrically conductive material on the surface of the conductor track. In this case, the second accumulation of an electrically conductive material can be situated opposite a second electrical contact of the carrier. The electrically conductive adhesive is at least also arranged between the second accumulation of an electrically conductive material and the second electrical contact and electrically and mechanically connects them to one another.

The second accumulation of an electrically conductive material can accordingly be arranged on the conductor track, which can be formed by a conductor loop having two ends, on a second end of the conductor loop and the first accumulation of an electrically conductive material can be arranged on a first end of the conductor track. The conductor loop can be formed for example in the shape of an open circle, an open rectangle, an open ellipse or a comparable shape.

A method for testing an electrical device with regard to its functionality comprises: applying a measuring sensor to each of the first and second electrical contacts of the carrier, and measuring an electrical variable, in particular voltage drop, resistance, or electrical conductance, via the conductor track. On the basis of such a measured value, it may be possible to deduce a possible malfunction of an electrical device.

BRIEF DESCRIPTION OF THE DRAWINGS

Exemplary embodiments of the invention are explained in greater detail below with reference to the accompanying drawings, in which, in each case schematically.

DETAILED DESCRIPTION OF ILLUSTRATIVE EMBODIMENTS

Figure 1:
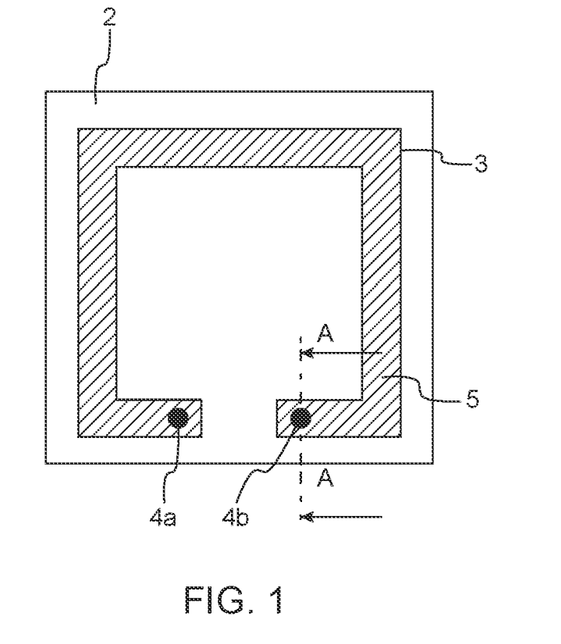
FIG. 1 shows a plan view of one exemplary embodiment of a substrate of an electrical device.

FIG. 1 shows a plan view of one exemplary embodiment of a substrate (2) of an electrical device (1) according to the invention. A conductor track (3) in the shape of a conductor loop is arranged on the substrate (2). In this case, the conductor loop comprises a first end and a second end and, as illustrated in FIG. 1, is arranged for example in the shape of an open rectangle on a for example square substrate (2). However, it is likewise possible to arrange the conductor track in the shape of an open circle, in the shape of an open ellipse or in a comparable shape on a surface of the substrate (2), which can for example also be formed in the shape of a circle, an ellipse or some other comparable shape.

The conductor track (3) is applied in the shape of a thin layer, in particular thin in relation to the main extension direction of the conductor track (3), on a surface of the substrate (2). Furthermore, the conductor track (3) covers a surface of the substrate (2) only partly, in some embodiments in particular to the extent of less than 50%, to the extent of less than 25%, to the extent of less than 10%, or to the extent of less than 5%.

On the top side of the conductor track (3), which is the opposite side with respect to the substrate, a first accumulation of an electrically conductive material (4a) is arranged on the first end of said conductor track and a second accumulation of an electrically conductive material (4b) is arranged on the second end of said conductor track.

The first and second accumulations of an electrically conductive material (4a, 4b) respectively cover the first and second ends of the conductor track (3) only in parts. In this regard, it may be expedient, for example, for the first and second accumulations of an electrically conductive material (4a, 4b), as seen in plan view, to have a smaller area, in particular much smaller area, than the area of the conductor track (3) as seen in plan view. In some embodiments, however, it is also possible for the first and second accumulations of an electrically conductive material (4a, 4b) to respectively cover the first and second ends of the conductor track (3) completely in each case.

Figure 2A:
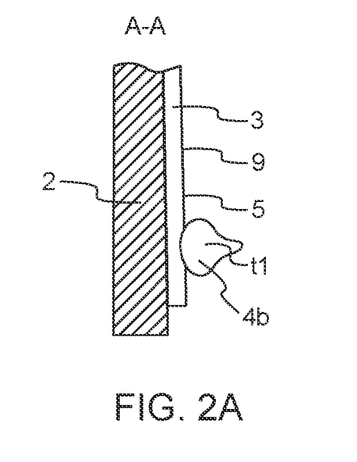
FIGS. 2A and 2B show sectional views through the substrate of two exemplary embodiments of an electrical device.
Figure 2B:
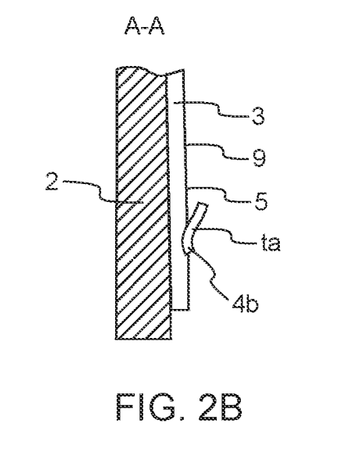

FIGS. 2A and 2B each show a sectional view along the dashed line A-A in FIG. 1. The two figures accordingly show a sectional or side view through the substrate (2), the conductor track (3), and also the second accumulation of an electrically conductive material (4b).

An oxidized layer (9) is arranged on the opposite surface (5) of the conductor track (3) with respect to the substrate (2). Besides the surface (5), the oxidized layer (9) is also arranged on the side walls of the conductor tracks (3). In this case, the oxidized layer (9) is formed in particular so as to be thin in relation to the thickness of the conductor track (3) and usually has a thickness of a few nanometers.

Furthermore, the oxidized layer (9) is interrupted in the region of the at least second accumulation of an electrically conductive material (4b) or is perforated by at least the second accumulation of an electrically conductive material (4b). Accordingly, a direct contact between at least the second accumulation of an electrically conductive material (4b) and the conductor track (3) is realized at least in the region of the second accumulation of an electrically conductive material (4b).

The first and second accumulations of an electrically conductive material (4a, 4b) can be applied to the surface of the conductor track for example by means of a method similar to a wire bonding process, in particular a ball-wedge bonding process or a wedge-wedge bonding process. However, this is not intended to be limiting thereto, rather the first and second accumulations of an electrically conductive material (4a, 4b) can also be applied to the conductor track by means of a comparable process.

As shown in FIG. 2A, at least the second accumulation of an electrically conductive material (4b) is formed in the shape of a drop. However, it is likewise also possible for at least the second accumulation of an electrically conductive material (4b) to be formed in the shape of a tail (ta), as shown in FIG. 2B. In this case, the shape of a drop (t1) is formed to the greatest possible extent in a manner corresponding to the shape of the ball of a ball-wedge bonding process, i.e. a ball having a material stump protruding therefrom. The shape of a tail (ta) as illustrated in FIG. 2B is formed to the greatest possible extent in a manner corresponding to a tail of a wedge-wedge bonding process, i.e. a wire which is pressed flat onto the conductor track in one region and, in a region adjacent thereto, has a material stump protruding therefrom. However, this is not intended to be limiting to the shapes known from the wire bonding process, rather it is likewise conceivable for the accumulation of an electrically conductive material also to have other comparable shapes.

Figure 3A:
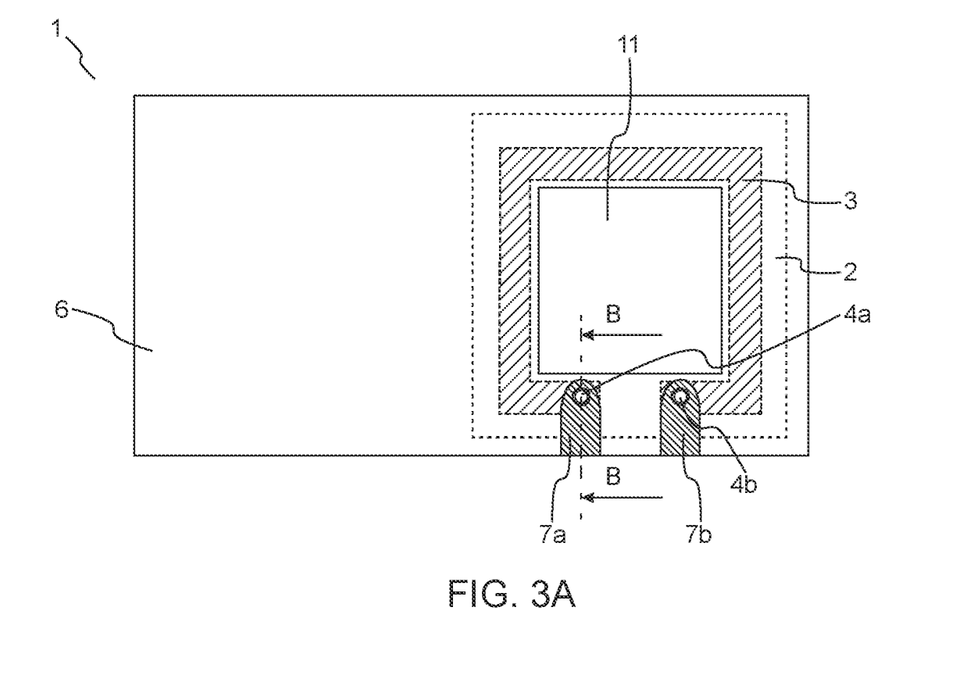
FIG. 3A shows a plan view of one exemplary embodiment of an electrical device.

FIG. 3A shows one exemplary embodiment according to the invention of an electrical device (1). The substrate (2) having the conductor track (3) situated thereon is arranged on a carrier (6) having the electrical contacts (7a, 7b) situated thereon. The substrate (2) having the conductor track (3) situated thereon and the accumulation of an electrically conductive material (4a, 4b) in turn situated thereon and the carrier (6) are arranged in such a way that the first and second accumulations of an electrically conductive material (4a, 4b) and a respective electrical contact (7a, 7b) are situated opposite and at a distance from one another.

Figure 3B:
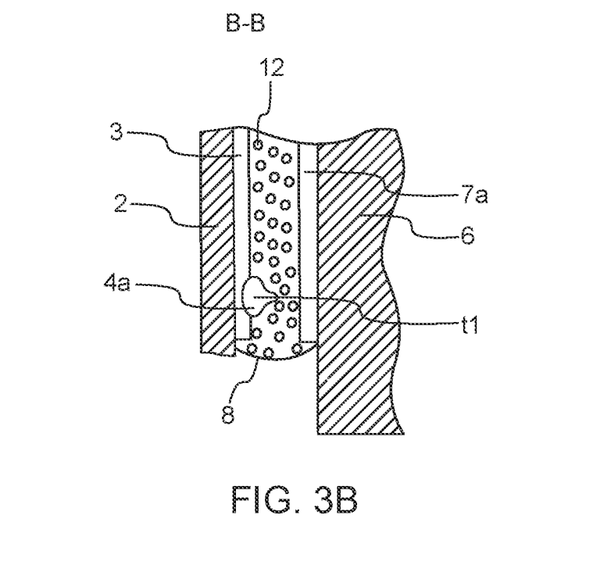
FIG. 3B shows a sectional view of one exemplary embodiment of an electrical device.

Furthermore, an electrically conductive adhesive (8) is arranged between at least the first accumulation of an electrically conductive material (4a) and at least one of the electrical contacts (7a) in accordance with the sectional view along the line B-B in FIG. 3B. A mechanical connection between the substrate (2) and the carrier (6) and also an electrical connection between at least the first accumulation of an electrically conductive material (4a, 4b) and at least one of the electrical contacts (7a) are provided by means of said electrically conductive adhesive (8).

As shown in FIG. 3A, the carrier (6) has a window (ii), on which the substrate (2) having the conductor track (3) situated thereon is arranged. Furthermore, the carrier can have a cavity, not illustrated, in which the substrate (2) having the conductor track (3) situated thereon can be arranged. On account of the arrangement in the cavity, it may be possible, for example, that a connection by means of a mechanical pressure, such as US welding, for example, is made more difficult owing to the space available. Accordingly, the present invention proposes a method in which an at least first and an at least second accumulation of an electrically conductive material (4a, 4b) are applied to the conductor track (3) for example by means of a mechanical method, such as US welding, for example, and the resultant intermediate product is adhesively bonded onto electrical contacts (7a, 7b) into a cavity of a carrier (6) by means of an electrically conductive adhesive (8). As a result, it is possible to decouple a mechanical process and an adhesive bonding process.

In further embodiments, not illustrated, it is also possible for the electrically conductive adhesive to be formed laminarly between the conductor track (3) and the electrical contacts (7a, 7b) and/or between the conductor track (3) and the carrier (6) and/or between the substrate (2) and the carrier (6) and/or between the substrate (2) and the electrical contacts (7a, 7b).

The electrical contacts (7a, 7b) can be formed for example from a material such as gold, silver, or a comparable conductive material, and can be configured to enable the conductor track (3) to be electrically contacted via the electrically conductive adhesive and the first and second accumulations of an electrically conductive material (4a, 4b).

In accordance with FIG. 3B, the electrically conductive adhesive (8) comprises electrically conductive particles (12). As a result, it is possible to provide an electrical connection between the first and second accumulations of an electrically conductive material (4a, 4b) and the electrical contacts (7a, 7b). By increasing the concentration of the electrically conductive particles (12) in the electrically conductive adhesive (8), it is possible to provide an improved electrical connection between the first and second accumulations of an electrically conductive material (4a, 4b) and the electrical contacts (7a, 7b).

Figure 4:
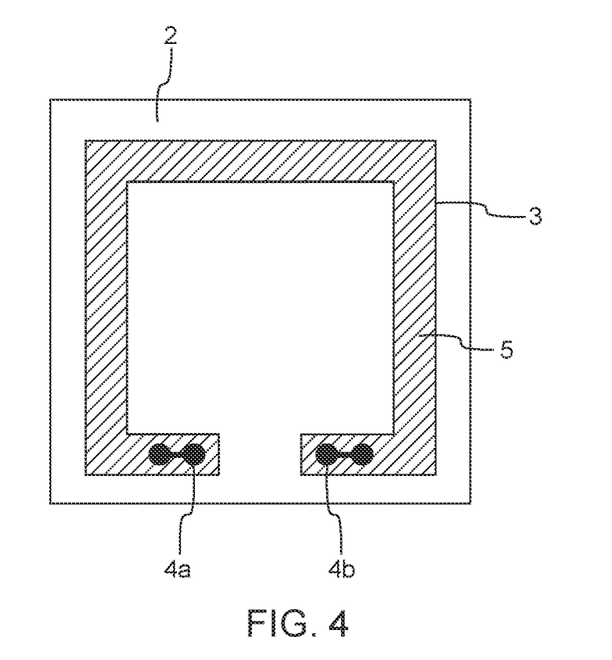
FIG. 4 shows yet another plan view of one exemplary embodiment of a substrate of an electrical device.

FIG. 4 shows a further exemplary embodiment of a substrate (2) of an electrical device (i) according to the invention. In contrast to the exemplary embodiment shown in FIG. 1, the first and second accumulations of an electrically conductive material (4a, 4b) have two regions which are mechanically connected to the leadframe and which are connected to one another via a wire, for example a bonding wire.

Figure 5A:
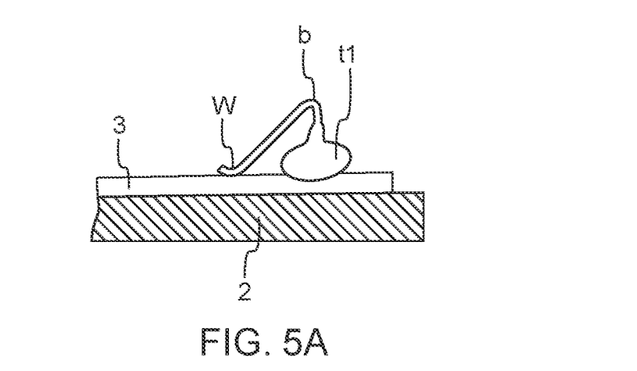
FIGS. 5A and 5B show further sectional views through the substrate of two exemplary embodiments of an electrical device.
Figure 5B:
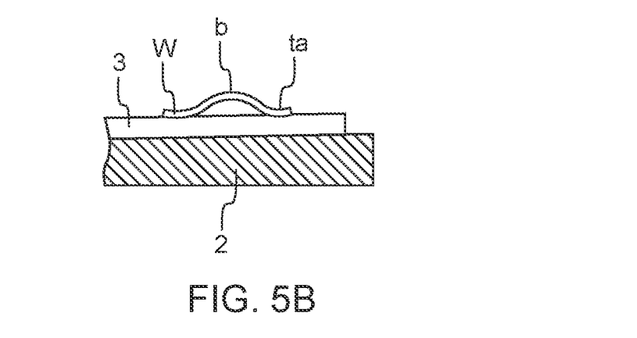

This is shown in more specific detail once again in a side/sectional view in FIGS. 5A and 5B. FIIG. 5A shows for example a first or second accumulation of an electrically conductive material (4a, 4b) comprising a first drop (t1) and a wedge (w), which are connected to one another via a bonding wire (b). In contrast thereto, FIG. 5B shows a first or second accumulation of an electrically conductive material (4a, 4b) comprising a tail (ta) and a wedge (w), which are likewise connected to one another via a bonding wire (b).

The shapes of a first and/or second accumulation of an electrically conductive material (4a, 4b) as shown in FIGS. 5A and 5B can thus be produced for example by means of a commercial wire bonding process, in particular a ball-wedge bonding process or a wedge-wedge bonding process. However, this is not intended to be limiting thereto, rather the shapes can also be applied to the conductor track by means of a comparable process.

Figure 6:
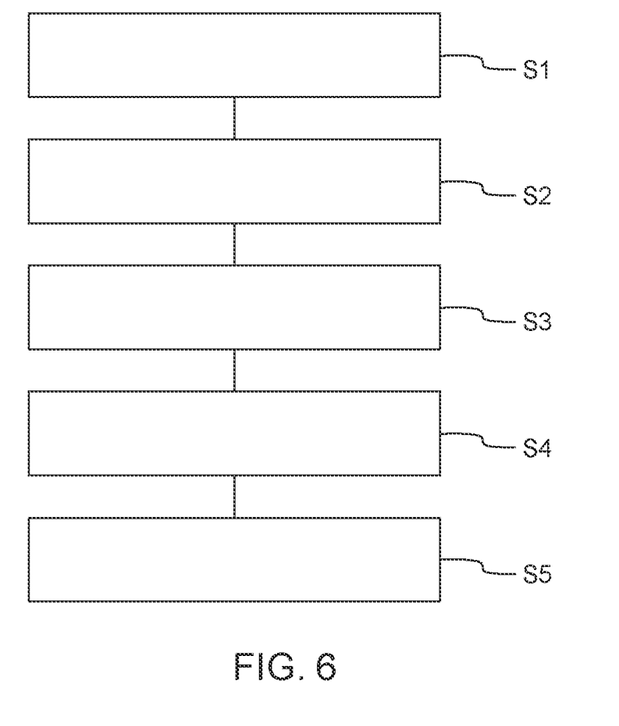
FIG. 6 shows a method for producing an electrical device according to embodiments of the invention.

FIG. 6 shows steps S1-S6 of a method according to the invention for producing an electrical device. In a step S1, a substrate having at least one conductor track situated thereon is provided. In this case, the conductor track can be formed in the shape of a conductor loop and can be embodied for example in the shape of an open rectangle, in the shape of an open circle, in the shape of an open ellipse, or a comparable shape. The material of the conductor track can be for example cost-effective materials, such as aluminum, copper, a metal alloy comprising aluminum or copper, or a comparable material.

In a step S2, at least one accumulation of an electrically conductive material is subsequently applied to a surface of the conductor track, in particular to an opposite surface of the conductor track with respect to the substrate. In this case, applying the at least one accumulation of an electrically conductive material optionally comprises the following steps: providing an electrically conductive material for example in the form of a bonding wire, in particular continuous bonding wire; arranging the electrically conductive material, in particular a part of the electrically conductive material, on the surface of the conductor track; melting the electrically conductive material, in particular a part of the electrically conductive material; connecting the electrically conductive material to the conductor track, wherein the connecting is realized by at least one of the following methods: ultrasonic bonding, ultrasonic welding, spot welding and wire bonding.

In this case, the optional step of connecting is realized in particular by means of a mechanical method in order to perforate an oxide layer that possibly envelops the conductor track, and to provide a direct contact between the conductor track and the at least one accumulation of an electrically conductive material.

The at least one accumulation of the electrically conductive material can comprise at least one of the following materials: gold, silver, copper, a combination of these materials, and a metal having a higher standard potential than a material of the conductor track.

In a step S3, a carrier having at least one electrical contact situated thereon is provided. In this case, the carrier can have for example a cavity and/or a window or a perforation and the at least one electrical contact can comprise a material such as gold, silver, or a comparable material. In particular, it may be possible for the material of the at least one electrical contact situated on the carrier to differ from the material of the conductor track.

In a step S4, an electrically conductive adhesive is applied to at least one out of the accumulation of the electrically conductive material and the at least one electrical contact. In further embodiments, however, the adhesive is for example also applied to the conductor track and/or the substrate and/or to the carrier.

In a step S5, the substrate and the carrier are arranged with respect to one another in such a way that the at least one accumulation of the electrically conductive material and the at least one electrical contact are situated opposite and at a distance from one another. In this case, the electrically conductive adhesive produces in particular a mechanical and electrical connection between the accumulation of the electrically conductive material and the at least one electrical contact.

Figure 7:
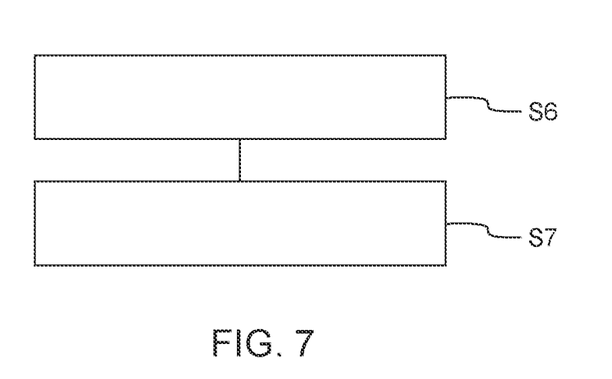
FIG. 7 shows a method for testing an electrical device according to embodiments of the invention with regard to its functionality.

FIG. 7 shows steps S6-S7 of a method according to the invention for testing one of the electrical devices described above. In this case, in a step S6, a measuring sensor is applied to each of the first and second electrical contacts of the carrier. A step S7 subsequently involves measuring an electrical variable, in particular the voltage drop, the resistance, or the electrical conductance, via the conductor track.

On the basis of such a measured value, it may be possible, in a further step, to deduce a possible malfunction of the electrical device.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A method for producing an electrical device, the method comprising:
   providing a substrate having at least one conductor track situated thereon;
   applying at least one accumulation of an electrically conductive material to a surface of the conductor track;
   providing a carrier having at least one electrical contact;
   applying an electrically conductive adhesive to the at least one accumulation of the electrically conductive material and/or the at least one electrical contact; and
   arranging the substrate and the carrier such that the at least one accumulation of the electrically conductive material and the at least one electrical contact are situated opposite and at a distance from one another,
   wherein the electrically conductive adhesive forms a mechanical and electrical connection between the at least one accumulation of the electrically conductive material and the at least one electrical contact, and
   wherein an interspace between the at least one accumulation of the electrically conductive material and the at least one electrical contact is filled with the electrically conductive adhesive.

2. The method as claimed in claim 1, wherein the conductor track comprises aluminum.

3. The method as claimed in claim 1, wherein the at least one accumulation of the electrically conductive material comprises at least one of the following materials gold, silver, copper, combinations thereof or a metal having a higher standard potential than a material of the conductor track.

4. The method as claimed in claim 1, wherein the surface of the conductor track has an oxidized layer, and wherein the oxidized layer is removed and/or perforated in a region of the at least one accumulation of the electrically conductive material.

5. The method as claimed in claim 1, wherein the at least one accumulation of the electrically conductive material has a shape of at least one drop and/or tail and/or wedge.

6. The method as claimed in claim 5, wherein the shape of the at least one drop and/or tail and/or wedge is realized by the electrically conductive material being applied and/or melted onto the surface of the conductor track, and wherein a material excess that protrudes from the at least one drop and/or tail and/or wedge is torn off and/or sheared off at a location directly above the at least one drop and/or tail and/or wedge.

7. The method as claimed in claim 5, wherein at least two out of the at least one drop, tail and wedge are connected to one another via a bonding wire.

8. The method as claimed in claim 1, wherein applying the at least one accumulation of the electrically conductive material to the surface of the conductor track is realized by at least one of the following methods: ultrasonic bonding, ultrasonic welding, spot welding, or wire bonding.

9. The method as claimed in claim 1, wherein the substrate comprises an optoelectronic component.

10. The method as claimed in claim 9, wherein the conductor track comprises at least one conductor loop having at least two ends, and wherein the conductor track is configured for checking a functionality of the optoelectronic component.

11. The method as claimed in claim 1, wherein the carrier has a cavity, in which the substrate having the conductor track situated thereon, is arranged.

12. An electrical device comprising:
a substrate having at least one conductor track situated thereon;
a first accumulation of an electrically conductive material on a surface of the conductor track;
a carrier having a first electrical contact; and
an electrically conductive adhesive,
wherein the substrate and the carrier are arranged such that the first accumulation of the electrically conductive material and the first electrical contact are situated opposite and at a distance from one another, and
wherein the electrically conductive adhesive arranged between the first accumulation of the electrically conductive material and the first electrical contact and the electrically conductive adhesive electrically and mechanically connects the substrate and the carrier to one another, and
wherein an interspace between the first accumulation of the electrically conductive material and the first electrical contact is filled with the electrically conductive adhesive.

13. The electrical device as claimed in claim 12, wherein the conductor track comprises aluminum.

14. The electrical device as claimed in claim 12, wherein the first accumulation of the electrically conductive material comprises at least one of gold, silver, copper, combinations thereof or a metal having a higher standard potential than a material of the conductor track.

15. The electrical device as claimed in claim 12, wherein the surface of the conductor track comprises an oxidized layer, and wherein the oxidized layer is removed and/or perforated in a region of the first accumulation of the electrically conductive material.

16. The electrical device as claimed in claim 12, wherein the first accumulation of the electrically conductive material is formed in a shape of a first drop or a tail and has a torn-off area and/or a cut area at a location directly above the first drop or tail.

17. The electrical device as claimed in claim 16, wherein the first accumulation of the electrically conductive material comprises the shape of the first drop or the tail, from which a bonding wire runs to a second drop or a wedge, and wherein the second drop or wedge is arranged at a distance from the first drop or the tail likewise on the conductor track.

18. The electrical device as claimed in claim 12, wherein the substrate comprises an optoelectronic component.

19. The electrical device as claimed in claim 12, further comprising:
a second accumulation of an electrically conductive material on the surface of the conductor track,
wherein the second accumulation of the electrically conductive material is situated opposite a second electrical contact of the carrier, and
wherein the electrically conductive adhesive is at least also arranged between the second accumulation of the electrically conductive material and the second electrical contact and electrically and mechanically connects them to one another.

20. The electrical device as claimed in claim 19, wherein the conductor track comprises at least one conductor loop having at least two ends, and wherein the first and second accumulations of the electrically conductive material are each arranged at one end of the conductor track.

21. A method for testing the electrical device as claimed in claim 20, the method comprising:
applying a measuring sensor to each of the first and second electrical contacts; and
measuring, via the conductor, a voltage drop, a resistance, or an electrical conductance.

* * * * *